United States Patent [19]

Beneking

[11] Patent Number: 4,963,947
[45] Date of Patent: Oct. 16, 1990

[54] SEMICONDUCTOR ARRAY

[75] Inventor: Heinz Beneking, Aachen, Fed. Rep. of Germany

[73] Assignee: Telefunken Electronic GmbH, Heilbronn, Fed. Rep. of Germany

[21] Appl. No.: 307,255

[22] Filed: Feb. 7, 1989

[30] Foreign Application Priority Data

Feb. 13, 1988 [DE] Fed. Rep. of Germany ....... 3804569

[51] Int. Cl.$^5$ ............................................ H01L 49/02
[52] U.S. Cl. ........................................ 357/4; 357/13; 357/30
[58] Field of Search ................. 357/30 A, 30 F, 30 L, 357/4 SL, 58, 13

[56] References Cited

U.S. PATENT DOCUMENTS 4,486,765 12/1984 Capasso .......................... 357/30 A
4,799,090 1/1989 Nishizawa ........................... 357/12
4,839,706 6/1989 Brennan ........................... 357/30 A

OTHER PUBLICATIONS

Article by J. A. Cooper, Jr. et al; IEEE Electron Device Letters, EDL-3, No. 12, 1982, pp. 407 and 408.
"Molecular Beam Epitaxy and Hetero Structures", pp. 533–535.
"Electron Transport in GaAs $n^+$-$p^-$-$n^+$ . . . ", pp. 409–411.
"Proceeding of the 17th International . . . ", pp. 495–498.

Primary Examiner—Rolf Hille
Assistant Examiner—Courtney A. Bowers
Attorney, Agent, or Firm—Spencer & Frank

[57] ABSTRACT

The mean drift speed of charge carriers in a semiconductor element can be increased if this semiconductor element has narrow layers which are alternately n-doped and p-doped on their planes, with undoped semiconductor material between these layers. A structure of this type is however difficult to manufacture, since it requires both doping zones in layer thicknesses of 2 nm and undoped semiconductor material between these doped zones. The semiconductor element in accordance with the invention therefore has successive layer sequences comprising two highly-doped layers with opposing conductivity. A weakly doped intermediate layer is arranged between each pair of layer sequences. These structures in accordance with the invention can be manufactured with MBE, LPCVD and MDVPE methods. To increase the switching frequency of pin diodes this structure in accordance with the invention can be incorporated into the intrinsic zones of these diodes.

14 Claims, 2 Drawing Sheets

SEMICONDUCTOR ARRAY

BACKGROUND OF THE INVENTION

The invention relates to a semiconductor array having a semiconductor element containing several successive narrow layers which are alternately n-doped and p-doped, to methods for maintaining the semiconductor array, and to its use.

Such structures are known, for example from the article by J. A. Cooper, JR. et al. in the periodical IEEE Electron Device Letters, EDL-3, No. 12, 1982, pages 407 and 408, and permit an increase in the mean drift speed of electrons in semiconductors. This speed increase is achieved by a step-like potential pattern provided in a semiconductor and shown in FIG. 1a. From this, a periodically structured electrical field in accordance with FIG. 1b builds up, comprising a sequence of narrow areas with high field strength ($E_1$) and overlaid by a background field with low field strength ($E_0$). This periodic field pattern subjects the electrons periodically to an acceleration, so that a wave-like pattern of the speed is generated as shown in the graph in FIG. 1c, thereby causing an increase in the mean drift speed.

The conduction mechanism underlying this phenomenon depends substantially on the band structure of the semiconductor used. The semiconductor material GaAs, a III/V connecting semiconductor, has a high electron mobility of approx. $1.8 \times 10^7$ cm/sec, since the electrons in the gamma minimum have a low effective mass. The band structure of gallium arsenide does however have a side minimum which is only a few tenths of an electron volt above the gamma minimum. With sufficiently high fields the conducting electrons can pass over into this side minimum, so causing a considerable fall in electron mobility, since the electrons have in the side minimum an effective mass which is greater than that in the central gamma minimum by a factor of 5. If the electrons are now held by suitable measures in the central gamma minimum, they retain their high electron mobility, resulting in a high mean drift speed. This is achieved by the electrons losing energy by polar dispersion to polar phonons while having to scale the step-like potential structure, and thereby not being able to pass over into the side minimum.

The increase in the mean drift speed in silicon or germanium is due, unlike in gallium-arsenide, to differing values for the energy and pluse relaxation times. The electrons in these semiconductor materials are accelerated by the periodically occurring high field strength beyond the thermal balance value for the speed, before being decelerated back to the balance value in the subsequent weak field area by pulse and energy relaxation processes. These processes also include dispersion processes to phonons, where the dispersion frequency of these processes depends very strongly on energy. The electrons are conducted in these structures in a series of equivalent delta valleys of the band structure.

In the above publication, page 408, left-hand column, 2nd paragraph, electrical field strength profiles of this type are achieved by narrow areas, each having a layer thickness of 2 nm, with alternate n-doping and p-doping on their planes, and following each other successively, in an undoped semiconductor element, with an n-layer being combined with a subsequent p-layer spaced 20 nm from it to provide a layer pair. The distance between two such layer pairs is 400 nm. An array of this type is however technologically scarcely feasible; since it requires doped layer thicknesses of 2 nm as well as up-doped semiconductor materials between these layers. In addition, this array has the drawback that space charges resulting from the current flow have a detrimental effect on the required field profile, i.e. on the step-like potential pattern necessary for the required effect.

SUMMARY OF THE INVENTION

The object of the invention is therefore to provide a semiconductor array of the type mentioned at the outset that is technilogically easy to manufacture and is so doped that the required field profile is maintained in spite of space charge effects.

This object is attained in accordance with the invention by arranging the layers directly adjacent to one another in pairs and separating them from adjacent layer pairs by intermediate areas which are weakly doped compared with the doping of these layer pairs.

In an advantageous embodiment of the invention, intermediate areas are provided whose extent is large in comparison with the thicknesses of the p- and n-layers.

An embodiment of the invention has highly doped n- and p-layers, giving the doping sequence $n^{++}$-$p^+$-$n^-$ and $p^{++}$-$n^+$-$p^-$ respectively. Here, the doping value $10^{19}$ atoms/cm$^3$ has proved advantageous for the $n^{++}$ layer, $3 \times 10^{17}$ atoms/cm$^3$ for the $p^+$ layer, and $10^{15}$ atoms/cm$^3$ for the intermediate areas. For the $p^{++}$-$n^+$-$p^-$ device, doping values of at least $8 \times 10^{18}$ atoms/cm$^3$ for the $p^{++}$ layer, of $3 \times 10^{17}$ atoms/cm$^3$ for the $n^+$ layer, and of approximately $2 \times 10^{15}$ atoms/cm$^3$ for the intermediate $p^-$ areas have proved advantageous.

A further preferred embodiment of the invention results from the fact that the Bethe criterion is fulfilled at the $p^+n^-$ and $n^+p^-$ junctions. The potential along a line w, which is shorter than the Debye length $L_D$, falls by more than the value kT here (k: Boltzmann's constant, T: absolute temperature), as indicated in FIG. 2c. This ensures that the electrons scale the potential barrier by thermal emission.

In a further embodiment of the invention the values of the thicknesses of the $n^{++}$ and $p^+$ layers are between 5 nm and 50 nm or between 10 nm and 40 nm, and those for the intermediate areas between 100 nm and 500 nm. In a particularly advantageous embodiment the $n^{++}$ layers and the $p^+$ layers are 50 nm or 30 nm thick, and the intermediate areas 250 nm thick.

Several methods can be used to manufacture the semiconductor array in accordacne with the invention. Both molecular beam expitaxy and low-pressure chemical vapour deposition are suitable for growing such layers, the latter process using phosphourus and boron as the n-dopant and p-dopant respectively for a semiconductor element consisting of silicon. These layers can advantageously be generated epitaxially also using metal-organic vapour phase epitaxy, with selenium and magnesium preferably being used as the n-dopant and p-dopant respectively if the semiconductor element is gallium-arsenide. All the methods stated here are characterized in that ultra-thin layers can be generated.

In accordance with the invention, the semiconductor array is used for the manufacture of integrated circuits, diodes and transistors.

BRIEF DESCRIPTION OF THE DRAWINGS

In the following the invention is described in greater detail on the basis of the embodiments of the invention illustrated in drawings, where.

DESCRIPTION OF THE PREFERRED EMBODIMENTS

Figure 1A:
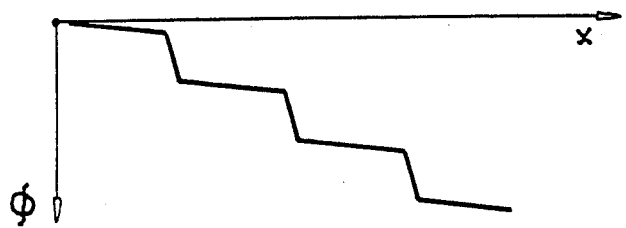
FIGS. 1a–1c show, respectively, the stepwise potential pattern, the periodically structured electrical field and the resulting wavelike pattern of the drift speed of electrons for a semiconductor element provided with several successive narrow layers which are alternatingly doped.
Figure 1B:
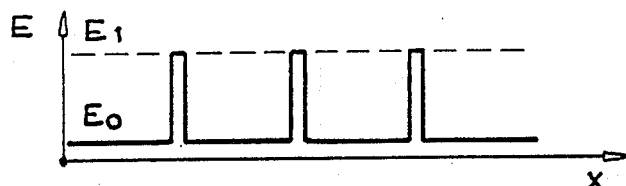
Figure 1C:
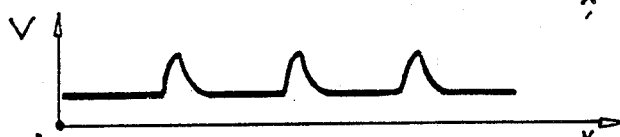
Figure 2A:
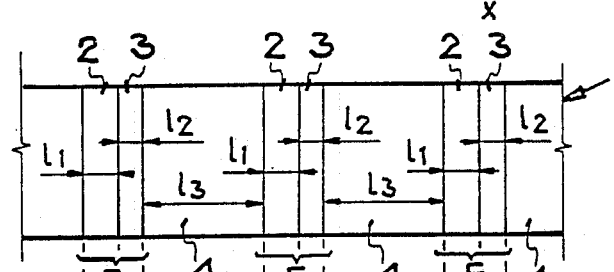
FIGS. 2a–2c show respectively a semiconductor having a layer sequence in accordance with the invention, the doping pattern and the appropriate potential pattern.
Figure 2B:
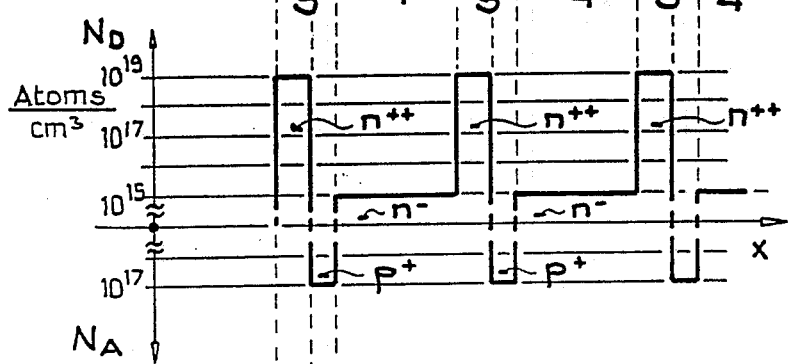
Figure 2C:
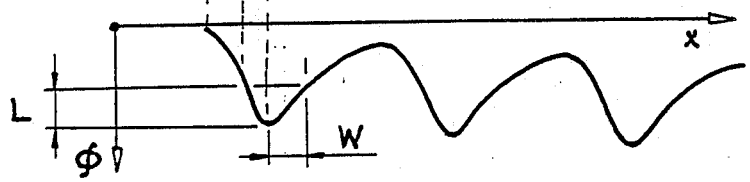

The semiconductor element 1 of silicon shown in FIG. 2a has a layer sequence comprising the layers 2, 3 and 4 that occur identically three times. The illustration below, FIG. 2b, shows the doping pattern associated with this layer sequence. From this it can be seen that an $n^{++}$-doped and a $p^+$-doped layer, 2 and 3 respectively, which together form an $n^{++}$-$p^+$ layer pair 5, succeed one another directly, with the $n^{++}$- and $p^+$-layers having a width $l_1$ and $l_2$ of 50 nm and 30 nm respectively. Furthermore, this diagram shows that two successive $n^{++}$-$p^+$ layer pairs 5 are separated from one another by 250 nm ($\triangleq l_3$) wide intermediate areas 4. The successive $n^{++}$-$p^+$ layer pairs 5 with the intervening intermediate areas 4 give, in the semiconductor element 1, a recurring $n^{++}$-$p^+$-$n^-$ layer sequence. The layers 2, 3 and 4, which are deposited using the LPCVD method, for example, are doped with $10^{19}$, $10^{17}$ and $10^{15}$ atoms$^2$, with phosphorus and boron being used as the n-dopant and p-dopant respectively. This ensures that the Bethe criterion is met, i.e. drops by a value L lower than the value kT (k: Boltzmann's constant, T: absolute temperature) at the $p^+n^-$ junction along a line w shorter than the Debye length $L_D$. A potential pattern fulfilling the Bethe criterion and corresponding to the above doping pattern is shown in graph form in FIG. 2c.

Figure 3:
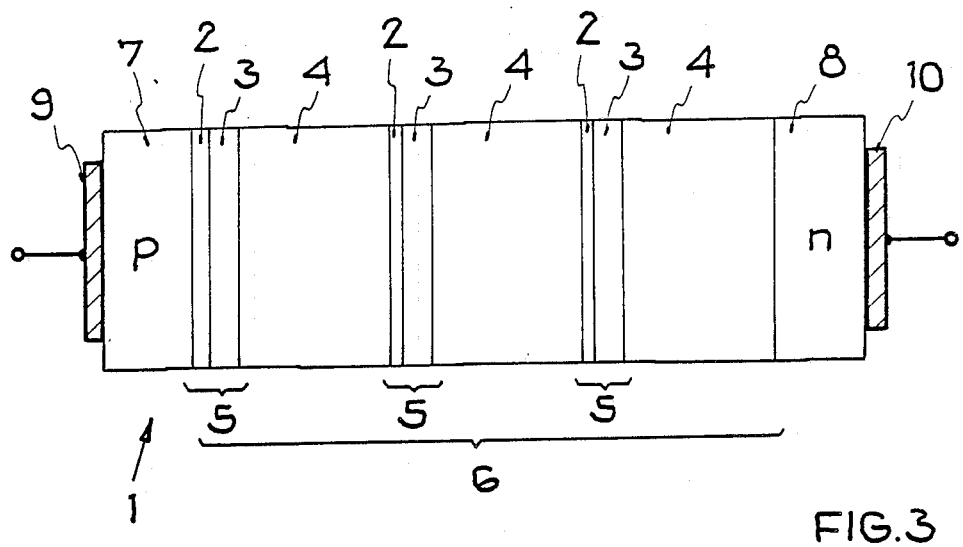
FIG. 3 shows a diagram of a pin diode in accordance with the use of the invention.

The intrinsic zone 6 of the pin diode 1 consisting of silicon and shown in FIG. 3 has a layer sequence corresponding to that of the semiconductor element 1 shown in FIG. 2a. With the recurring $n^{++}$-$p^+$ pairs 5 and the intermediate areas 4, the already known $n^{++}$-$p^+$-$n^-$ layer sequence recurring three times is obtained. The layer thicknesses of the $n^{++}$- and $p^+$-layers 2 and 3 of the $n^-$ intermediate areas 4 correspond to the values of the above embodiment, and the same applies for the doping values. The intrinsic zone 6 is arranged between a p-zone 7 and an n-zone 8, each of which have a thickness of approx. 2 μm. Phosphourus and boron are again used as the respective dopants. Contacts 9 and 10 of CrAuSnCr are provided on these zones 8 and 7 respectively to make the contact to the pin diode 1.

With this arrangement of the layer sequence in accordance with the invention in the intrinsic zone 6 of pin diode 1, the switching frequency of such diodes, which depends on the carrier transit time through the i-zone, increases.

What is claimed is:

1. A semiconductor array having a semiconductor element containing several successive narrow layers which are alternately n-doped and p-doped, wherein said layers are arranged directly adjacent to one another in pairs and are separated from adjacent layer pairs by intermediate areas which are weakly doped compared with the doping of said layer pairs, wherein the extent of the intermediate areas is large in comparison with the thicknesses of the p- and n-layers of the layer pairs, wherein the layer pairs are an $n^{++}$-$p^+$ layer sequence and wherein the intermediate areas are $n^{--doped}$.

2. A semiconductor array according to claim 1, wherein the doping of the $n^{++}$-layer is at least $10^{19}$ atoms/cm$^3$, approximately $3 \times 10^{17}$ atoms/cm$^3$ for the $p^+$ layer, and approximately $10^{15}$ atoms/cm$^3$ for the intermediate area.

3. A semiconductor array having a semiconductor element containing several successive narrow layers which are alternately n-doped and p-doped, wherein said layers are arranged directly adjacent to one another in pairs and are separated from adjacent layer pairs by intermediate areas which are weakly doped compared with the doping of said layer pairs, wherein the extent of the intermediate areas is large in comparison with the thicknesses of the p- and n-layers of the layer pairs, wherein the layer pairs are a $p^{++}$-$n^+$ layer sequence and wherein the intermediate areas are $p^-$-doped.

4. A semiconductor array according to claim 3, wherein the doping of the $p^{++}$-layer is at least $8 \times 10^{18}$ atoms/cm$^3$ approximately $3 \times 10^{17}$ atoms/cm$^3$ for the $n^+$layer, and approximately $2 \times 10^{15}$ atoms/cm$^3$ for the intermediate area.

5. A semiconductor array according to claim 1, wherein the layers of the layer pairs or the intermediate areas are so doped that the potential at the $p^{+n-}$ junction formed between a layer pair and an intermediate area drops along a line shorter than the Debye length ($L_D$) in the direction of the $n^-$-doped intermediate area by a value greater than the value kT, where k is Boltzmann's constant and T is the absolute temperature.

6. A semiconductor array according to claim 3, wherein the layers of the layer pairs or the intermediate areas are so doped that the potential at the $n^+p^-$ junction formed between a layer pair and an intermediate area drops along a line shorter than the Debye length ($L_D$) in the direction of the $p^-$-doped intermediate area by a value greater than the value kT, where k is Boltzmann's constant and T is the absolute temperature.

7. A semiconductor array according to claim 1, wherein the value of the thickness of the respective layers of the layer pair is between 5 nm and 50 nm and between 10 nm and 40 nm respectively, and the thickness of the intermediate area has a value between 100 nm and 500 nm.

8. A semiconductor array according to claim 7, wherein the $n^{++}$ layer and the $p^+$ layer have a thickness of 50 nm and 30 nm respectively, and the intermediate area has a thickness of 250 nm.

9. A semiconductor array according to claim 1, wherein the semiconductor element consists of silicon, and phosphorus and boron are used as the n-dopant and the p-dopant respectively.

10. A semiconductor array according to claim 2, wherein the semiconductor element consists of GaAs, and selenium and magnesium are used as the n-dopant and the p-dopant respectively.

11. An integrated circuit incorporating a semiconductor array as defined in claim 1.

12. A diode incorporating a semiconductor array as defined in claim 1.

13. A transistor incorporating a semiconductor array as defined in claim 1.

14. A diode incorporating a semiconductor array as defined in claim 3.

* * * * *